US008737146B2

(12) United States Patent
Kim et al.

(10) Patent No.: US 8,737,146 B2
(45) Date of Patent: May 27, 2014

(54) SEMICONDUCTOR MEMORY DEVICE HAVING REDUNDANCY CIRCUIT FOR REPAIRING DEFECTIVE UNIT CELL

(75) Inventors: Kwi-Dong Kim, Gyeonggi-do (KR); Ki-Chang Kwean, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 611 days.

(21) Appl. No.: 12/649,855

(22) Filed: Dec. 30, 2009

(65) Prior Publication Data

US 2011/0158012 A1    Jun. 30, 2011

(30) Foreign Application Priority Data

Dec. 29, 2009    (KR) .................. 10-2009-0132874

(51) Int. Cl.
*G11C 7/00*    (2006.01)

(52) U.S. Cl.
USPC ........................................................ 365/200

(58) Field of Classification Search
USPC ........................................................ 365/200
See application file for complete search history.

(56) References Cited

U.S. PATENT DOCUMENTS

| 6,118,712 | A  | * | 9/2000 | Park et al. ...................... 365/200 |
| 6,539,452 | B2 | * | 3/2003 | Tomita .............................. 711/1 |
| 2005/0007843 | A1 | * | 1/2005 | Choi et al. ..................... 365/200 |
| 2007/0070768 | A1 | * | 3/2007 | Kwak et al. .................... 365/222 |
| 2008/0123461 | A1 | * | 5/2008 | Kim et al. ................. 365/230.03 |
| 2009/0185438 | A1 | * | 7/2009 | Kim ............................. 365/200 |

FOREIGN PATENT DOCUMENTS

| JP | 09-167499 | 6/1997 |
| JP | 2002-093188 | 3/2002 |
| KR | 1020090079558 | 7/2009 |

OTHER PUBLICATIONS

Notice of Preliminary Rejection issued from Korean Intellectual Property Office on Mar. 16, 2011.

* cited by examiner

*Primary Examiner* — Anthan Tran
(74) *Attorney, Agent, or Firm* — IP & T Group LLP

(57) ABSTRACT

A semiconductor memory device includes a first bank including a plurality of cell matrices a second bank including a plurality of cell matrices and a shared-fuse set, which is shared by the first and second banks, configured to output a defect indication signal when the first bank or the second bank is enabled and a defective cell matrix is included in the enabled bank.

19 Claims, 9 Drawing Sheets

SEMICONDUCTOR MEMORY DEVICE HAVING REDUNDANCY CIRCUIT FOR REPAIRING DEFECTIVE UNIT CELL

CROSS-REFERENCE TO RELATED APPLICATION

The present invention claims priority of Korean patent application number 10-2009-0132874, filed on Dec. 29, 2009, which is incorporated by reference in its entirety.

BACKGROUND OF THE INVENTION

Exemplary embodiments of the present invention relate to a semiconductor memory device, and more particularly, to a semiconductor memory device that increases the efficiency of a column redundancy circuit for repairing a defective unit cell and reducing a total area in a semiconductor memory device.

In a system with a variety of semiconductor devices, a semiconductor memory device may serve as data storage. The semiconductor memory device may output data corresponding to address received from a data processor, for example, a central processing unit (CPU), or store data received from the data processor into memory cells selected by address.

As the operating speed of the system increases and semiconductor integrated circuit technologies advance, higher speed input/output operations of semiconductor memory devices are desired. There is an ongoing demand for semiconductor memory devices that can store more data, read and write data rapidly, and reduce power consumption. In meeting such demands, widths of signal lines for transferring various signals in a semiconductor memory device, and the size of a unit cell for storing data have been becoming gradually smaller. As a result, a number of signal lines and a number of unit cells included in a semiconductor chip are increasing in order to meet the demands for high capacity semiconductor memory devices.

However, the design and fabrication process of a high capacity semiconductor memory device is also becoming more difficult. For example, as elements included in a semiconductor memory device shrink in size, defects tend to occur. Particularly, defects may exist between signal lines or between a signal line and a unit cell, where such defects contribute to an increase in the defect rate of semiconductor memory devices. When such defects are not properly repaired/compensated in semiconductor memory devices, production yields may suffer. As a way to address such a concern, semiconductor memory devices may include a column redundancy circuit configured to detect and repair defects.

A column redundancy circuit, which may be used to replace defective unit cells, is often included in each of a plurality of banks in a semiconductor memory device. Each bank may include cell matrices having unit cells, a row control region where circuits for accessing row addresses are provided, and a column control region where circuits for accessing column addresses are provided. The column redundancy circuit may include a row redundancy circuit configured to repair a row address of a defective unit cell, and a column redundancy circuit configured to repair a column address of the defective unit cell. The row redundancy circuit and the column redundancy circuit are respectively included in the row control region and the column control region in each bank.

FIG. 1 shows a diagram illustrating a conventional semiconductor memory device having a stack bank structure.

Referring to FIG. 1, column control regions of adjacent banks are arranged to contact each other in the conventional semiconductor memory device of the stack bank structure.

The semiconductor memory device in FIG. 1 includes a plurality of banks. Each of the banks typically includes cell matrices including a plurality of unit cells, a row control region including a row decoder (XDEC, which is not shown) configured to control word lines, and a column control region including a column decoder (YDEC) configured to control column lines. The column control region includes the column decoder (YDEC) configured to decode data output from the unit cells and the column redundancy circuit. In addition, the column control region of each bank in the semiconductor memory device includes a column redundancy circuit implemented with a plurality of fuses.

Each of adjacent banks includes a corresponding column redundancy circuit. A column redundancy circuit receives a column address for controlling the cell matrix in the bank, and functions to replace a column address corresponding to a defective unit cell with a column address of a spare cell for repairing the defective unit cell when a defect occurs in the unit cell. Such an operation is referred to as "a repairing operation".

Accordingly, as illustrated in FIG. 1, the semiconductor memory device includes a column redundancy circuit corresponding to column address of an upper bank BANK0, and a column redundancy circuit corresponding to column address of a lower bank BANK1.

FIG. 2 is a block diagram illustrating a conventional column redundancy circuit of the upper bank BANK0 in FIG. 1.

A conventional semiconductor may include a column redundancy circuit corresponding to column address of a first bank BANK0 and a column redundancy circuit corresponding to column address of a second bank BANK1, respectively. A fuse set 222 included in the first bank BANK0 detects a defective unit cell of the first bank BANK0 only.

Referring to FIG. 2, the column redundancy circuit of the first bank BANK0 includes a fuse unit 220 and a comparison unit 240.

The fuse unit 220 includes the fuse set 222 and a defective cell address generation unit 226.

The fuse set 222 outputs a defect indication signal YA_B0 based on reset signal WLCB_B0 and cell matrix signals XMAT_B0<0:n>. The reset signal WLCB_B0 is activated to reset a repair detect signal REP_DET at node A shown in FIG. 3 when the first bank BANK0 enters a precharge mode. The cell matrix signals XMAT_B0<0:n> are selectively activated to indicate a cell matrix selected among the cell matrices in the bank. The defect indication signal YA_B0 is activated to indicate that there is a defective unit cell in the selected cell matrix.

The defective cell address generation unit 226 receives the cell matrix signals XMAT_B0<0:n> and a bank enable signal WLCPB_LAT_B0. The bank enable signal WLCPB_LAT_B0 is activated when the first bank BANK0 is enabled. The defective cell address generation unit 226 is configured to output the column defective cell address YRA_B0 indicating locations of the defective unit cells. The number of the defective cell address generation units 226 is equal to the number of bits of the column address of the corresponding first bank BANK0. An operation of the defective cell address generation unit 226 is apparent to a person of ordinary skill in the art and thus, a further description thereof is omitted.

The comparison unit 240 compares the column defective cell address YRA_B0 output from the defective cell address generation unit 226 with an external column address AYT when the defect indication signal YA_B0 is activated. The comparison unit 240 outputs a redundancy enable signal SYEB_0 when the external column address AYT is the same as the column defective cell address YRA_B0.

FIG. 3 is a detailed circuit diagram of the conventional fuse set 222 in FIG. 2.

Referring to FIG. 3, the fuse set 222 includes a reset unit 310, a repair detect signal generation unit 320 and a latch unit 330.

The reset unit 310 resets the repair detect signal REP_DET at the node A to a logic high level in response to the reset signal WLCB_B0.

The reset unit 310 includes a PMOS transistor which resets the repair detect signal REP_DET to a logic high level of a power supply voltage VDD when the reset signal WLCB_B0 of a logic low level is input through a gate of the PMOS transistor.

While FIG. 3 does not show, the reset signal WLCB_B0 is generated by combining an active command and a precharge command of the first bank BANK0. The active command enables a corresponding cell matrix in response to a specific column address for a read operation or write operation.

Accordingly, the reset signal WLCB_B0 enables the reset unit 310 during a precharge mode of the first bank BANK0.

The repair detect signal generation unit 320 generates the repair detect signal REP_DET and provides it to the node A in response to the cell matrix signals XMAT_B0<0:n> and a cut state of the fuse.

The cell matrix signals XMAT_B0<0:n> represent an enabled cell matrix during an active mode of the first bank BANK0 for a read/write operation.

The repair detect signal generation unit 320 includes a plurality of unit fuse sets 320_1 to 320_n, which are coupled in parallel between the node A and a ground voltage (VSS) terminal.

Hereinafter, a first unit fuse set 320_1 is described in detail as an example of the plurality of unit fuse sets 320_1 to 320_n. The first unit fuse set 320_1 includes an NMOS transistor which applies a ground voltage VSS to a fuse F_1 when a first cell matrix signal XMAT_B0<0> of a logic high level is input at a gate of the NMOS transistor. The first unit fuse set 320_1 includes the fuse F_1 which applies the ground voltage VSS from the NMOS transistor to the node A in response to a cut state of the fuse F_1. The cut state of the fuse F_1 includes a cut-off state and a no-cut state.

The latch unit 330 latches the repair detect signal REP_DET at the node A to output the latched signal as the defect indication signal YA_B0 of the first bank BANK0. The latch unit 330 may include an inverter-latch which inverts and latches a repair detect signal.

The fuse F_1 corresponding to a defective unit cell detected during testing of a semiconductor memory device is cut off among the plurality fuses coupled in parallel each other. When a corresponding one of the cell matrix signals XMAT_B0<0:n> is enabled, the NMOS transistor corresponding to a selected cell matrix is turned-on to thereby apply a logic low level signal of the ground voltage VSS. However, when the selected cell matrix includes a defective unit cell, the repair detect signal REP_DET maintains its reset state of a logic high level since the fuse is in a cut-off state. On the contrary, when the selected cell matrix does not include a defective unit cell, the repair detect signal REP_DET has a logic low level and the defect indication signal YA_B0 of a logic low level since the fuse is in a no-cut state.

FIG. 4 is a timing diagram illustrating operations of the fuse set 222 in FIG. 3. Here, the operation of the fuse set 222 is started at a reset mode in which the repair detect signal REP_DET at the node A is reset to a logic high level by the reset signal WLCB_B0 of a logic low level. The NMOS transistor included in the fuse set F_1 is not turned-on by the cell matrix signal XMAT_B0<0> of a logic low level. Therefore, since the ground voltage VSS is not supplied to the node A, the repair detect signal REP_DET at the node A substantially maintains the logic high level.

The cell matrix signal XMAT_B0<0> transitions from the logic low level to a logic high level when the reset signal WLCB_B0 becomes a logic high level.

The ground voltage VSS is supplied to the fuse F_1 when the NMOS transistor is turned-on by the cell matrix signal XMAT_B0<0> of a logic high level.

When the selected cell matrix includes the defective unit cell, the ground voltage VSS is not supplied to the node A since the fuse F_1 is cut. The repair detect signal REP_DET at the node A substantially maintains the previous logic high level. The latch unit 330 outputs the repair detect signal REP_DET of a logic high level as the defect indication signal YA_B0.

On the contrary, when the selected cell matrix does not include a defective unit cell, the ground voltage VSS is supplied to the node A since the fuse F_1 is not cut. The repair detect signal REP_DET at the node A transitions from the logic high level to a logic low level. The latch unit 330 outputs the repair detect signal REP_DET of the logic low level as the defect indication signal YA_B0.

In a semiconductor memory device, it is desirable to reduce a total area of the semiconductor memory device for improving productivity.

Referring to FIGS. 1 to 4, the conventional banks each include a separate fuse set. Thus, while the conventional fuse set 222 detects a defective cell matrix included in the corresponding bank, it does not detect a defective cell matrix included in another bank.

As a semiconductor memory device decreases in size, a greater number of semiconductor memory devices may be produced on each wafer. However, as a greater number of semiconductor memory devices may be produced on each wafer, a greater number of column redundancy circuits for replacing defective unit cells are also required. Thus, such an increase in the number of column redundancy circuits for replacing defective unit cells raises a concern in producing high integration semiconductor memory devices.

SUMMARY OF THE INVENTION

An embodiment of the present invention is directed to providing a semiconductor memory device including a column redundancy circuit, capable of supporting a repair operation on each bank of unit cells while reducing a total size of the semiconductor memory device, in which adjacent banks share a fuse set for repairing a defective unit cell.

In accordance with an embodiment of the present invention, a semiconductor memory device includes a first bank including a plurality of cell matrices; a second bank including a plurality of cell matrices; and a shared-fuse set, which is shared by the first and second banks, configured to output a defect indication signal when the first bank or the second bank is enabled and a defective cell matrix is included in the enabled bank.

In accordance with another embodiment of the present invention, a semiconductor memory device includes a plurality of banks including a plurality of cell matrices; and a shared-fuse set, which is shared by the plurality of banks and configured to output a defect indication signal when at least one of the plurality of banks is enabled and a defective cell matrix is included in the enabled bank.

According to an exemplary embodiment of the present invention, adjacent banks share a fuse set for repairing a defective unit cell, thus making it possible to reduce the total size of the device. By having a stack bank structure where column control regions of adjacent banks are arranged to contact each other, the adjacent banks may share a column redundancy circuit. Thus, a size of the column redundancy circuit may be reduced and high integration of semiconductor memory devices may be achieved.

DESCRIPTION OF SPECIFIC EMBODIMENTS

Figure 1:
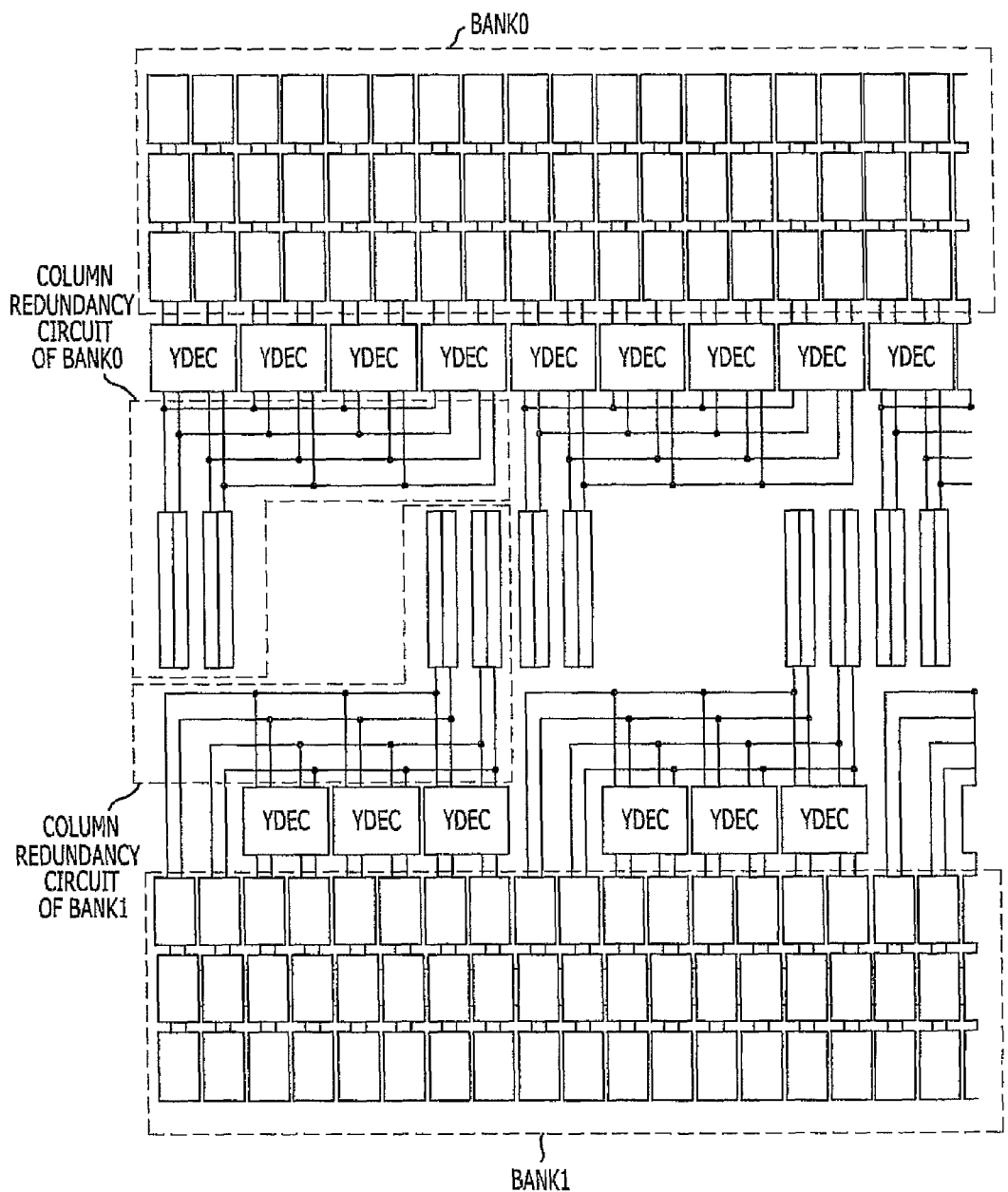
FIG. 1 shows a diagram illustrating a conventional semiconductor memory device.
Figure 2:
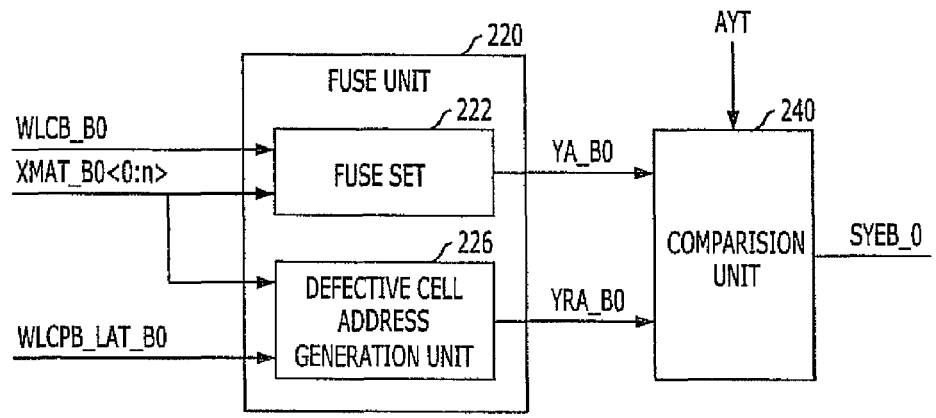
FIG. 2 is a block diagram of a conventional column redundancy circuit of the semiconductor memory device in FIG. 1.
Figure 3:
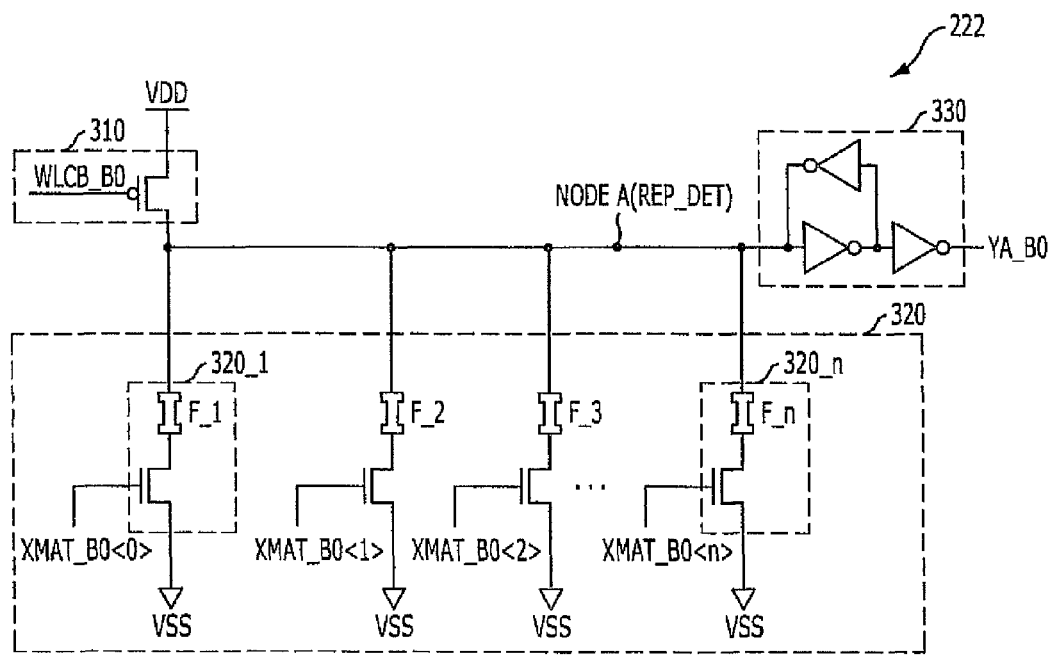
FIG. 3 is a detailed circuit diagram of the conventional fuse set in FIG. 2.
Figure 4:
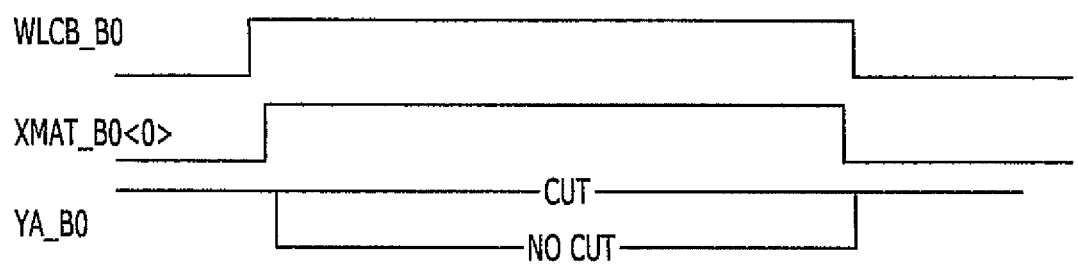
FIG. 4 is a timing diagram illustrating operations of the conventional fuse set in FIG. 3.

Exemplary embodiments of the present invention will be described below in more detail with reference to the accompanying drawings. The present invention may, however, be embodied in different from and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

According to an exemplary embodiment of the invention, a semiconductor memory device of a stack bank structure is designed to reduce a total area of the semiconductor memory device. In the stack bank structure, row control regions or column control regions of adjacent banks of a plurality of banks in a semiconductor memory device are arranged to contact with each other.

Figure 5:
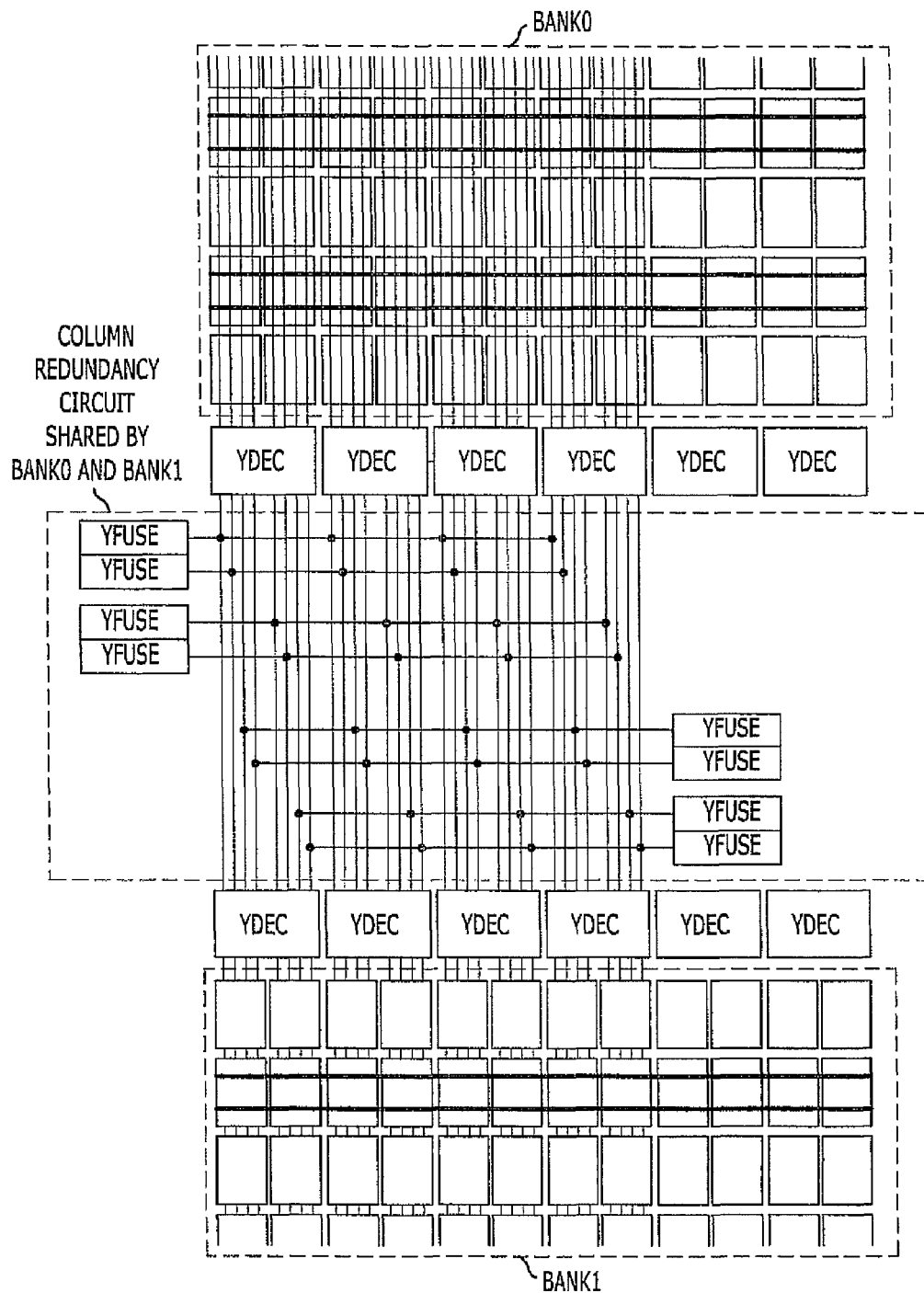
FIG. 5 shows a diagram illustrating a semiconductor memory device in accordance with an embodiment of the present invention.

FIG. 5 shows a diagram illustrating a semiconductor memory device of a stack bank structure in accordance with an embodiment of the present invention.

Referring to FIG. 5, the column control regions are arranged to contact each other in the semiconductor memory device having a stack bank structure. In addition, the column control region includes the column decoder YDEC for decoding data output from unit cells and a column redundancy circuit for repairing a defective unit cell. The column redundancy circuit is shared by a first bank BANK0 and a second bank BANK1.

The semiconductor memory device includes a plurality of banks each of which is provided with a plurality of unit cells. When an address for accessing a defective unit cell is input, two or more banks share a column redundancy circuit which is used for repairing the defective unit cell.

Two adjacent banks share the column redundancy circuit included in the column control region of the semiconductor memory device illustrated in FIG. 5. More specifically, the column redundancy circuit is coupled to both of the upper bank and the lower bank. The upper bank and the lower bank are referred to as "a first bank BANK0" and "a second bank BANK1." Compared to the conventional semiconductor memory device of FIG. 1 where a separate column redundancy circuit corresponding to a column address is included in each respective bank, a column redundancy circuit corresponding to a column address is shared by the two adjacent banks in the semiconductor memory device of FIG. 5.

As described above, the column redundancy circuit is used to replace a defective cell when a defect occurs in a specific unit cell of a bank configured with a plurality of unit cells after fabrication of the semiconductor memory device. Since defective unit cells in a bank occur at different locations, defective unit cells rarely occur at the same location of two adjacent banks. Accordingly, when two adjacent banks share a column redundancy circuit, it is possible to reduce the effective size of the column redundancy circuit to half. Thus, a semiconductor memory device according to an exemplary embodiment of the invention stores data of a defective unit cell in two adjacent banks in one common column redundancy circuit, and repairs the defective unit cell when an input address for accessing the data corresponds to the defective unit cell. By disposing such a column redundancy circuit between two adjacent banks, the overall size of the column redundancy circuits in a semiconductor memory device is reduced.

Figure 6:
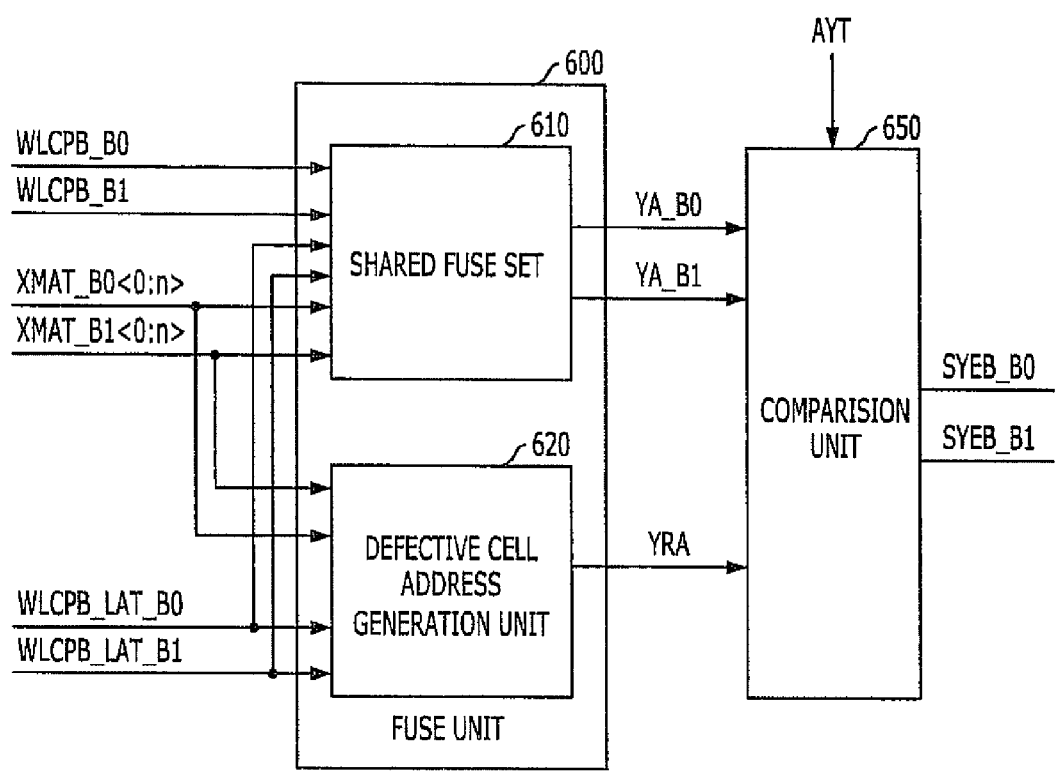
FIG. 6 is a block diagram of a column redundancy circuit of the semiconductor memory device in FIG. 5.

FIG. 6 is a block diagram of the column redundancy circuit shared by the first bank BANK0 and the second bank BANK1 in FIG. 5.

Referring to the FIG. 6, the column redundancy circuit shared by the first and second banks BANK0 and BANK1 includes a fuse unit 600 and a comparison unit 650.

The fuse unit 600 includes a shared-fuse set 610 and a defective cell address generation unit 620.

The shared-fuse set 610 receives a first reset signal WLCPB_B0 and a second reset signal WLCPB_B1, first cell matrix signals XMAT_B0<0:n> and second cell matrix signals XMAT_B1<0:n>, and a first bank enable signal WLCPB_LAT_B0 and a second bank enable signal WLCPB_LAT_B1.

Figure 7:
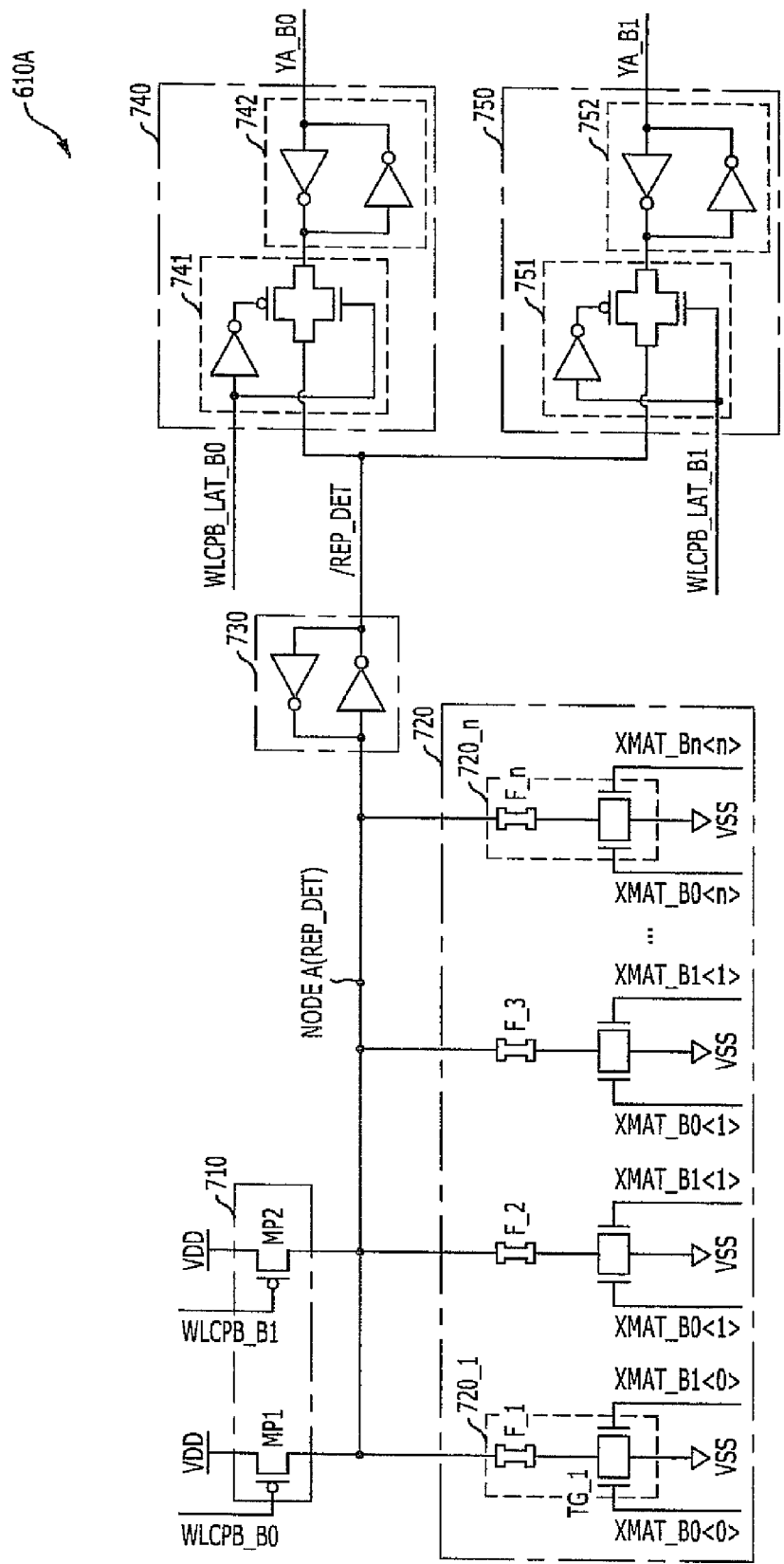
FIG. 7 is a circuit diagram of a shared-fuse set in accordance with an embodiment of the present invention.

The shared-fuse set 610 generates a repair detect signal REP_DET shown in FIG. 7 based on the first and second reset signals WLCPB_B0 and WLCPB_B1 and outputs the repair detect signal REP_DET as a first defect indication signal YA_B0 or a second defect indication signal YA_B1 in response to the first and second bank enable signals WLCPB_LAT_B0 and WLCPB_LAT_B1.

The first and second reset signals WLCPB_B0 and WLCPB_B1 are activated to reset the repair detect signal REP_DET when the first and second banks BANK0 or BANK1 enters a precharge mode. The first and second cell matrix signals XMAT_B0<0:n> and XMAT_B1<0:n> are activated to indicate selected cell matrix selected among the cell matrices in the first bank BANK0 and the second bank BANK1. The repair detect signal REP_DET indicates that there is a defective unit cell in the selected cell matrix corresponding to the first and second cell matrix signals XMAT_B0<0:n> and XMAT_B1<0:n>. The first and second bank enable signals WLCPB_LAT_B0 and WLCPB_LAT_B0 are activated when the first and second banks BANK0 and BANK1 are enabled, respectively. The first and second defect indication signals YA_B0 and YA_B1 indicate that there is a defective cell matrix in the respective one of the banks BANK0 and BANK1.

The defective cell address generation unit 620 receives the first and second cell matrix signals XMAT_B0<0:n> and XMAT_B1<0:n>, and the first and second bank enable signals WLCPB_LAT_B0 and WLCPB_LAT_B0.

The defective cell address generation unit 620 outputs a column defective cell address YRA indicating an address of the defective unit cells to the comparison unit 650.

The comparison unit 650 compares the column defective cell address YRA from the defective cell address generation unit 620 with an external column address AYT when any of the first and second defect indication signals YA_B0 and YA_B1 are activated. The comparison unit 650 outputs a first and a second redundancy enable signals SYEB_0 and SYEB_1 when the external column address AYT is the same as the column defective cell address YRA. Operations of the defective cell address generation unit 620 and the comparison unit 650 are apparent to those skilled in the art and thus, a description thereof is omitted.

FIG. 7 is a circuit diagram of a shared-fuse set in accordance with a first embodiment of the present invention.

The shared-fuse set in accordance with the first embodiment of the present invention is referred to as "a shared-fuse set 610A."

Referring to FIG. 7, the shared-fuse set 610A includes a reset unit 710, a repair detect signal generation unit 720, a first latch unit 730, a first defect indication signal output unit 740 and a second defect indication signal output unit 750.

The reset unit 710 resets the repair detect signal REP_DET at node A to a logic high level during a precharge mode of any of bank BANK0 or BANK1.

The reset unit 710 includes a first PMOS transistor MP1 and a second PMOS transistor MP2. The first PMOS transistor MP1 resets the repair detect signal REP_DET to a logic high level of a power supply voltage VDD when the first reset signal WLCPB_B0 of a logic low level is input at a gate of the first PMOS transistor MP1. The second PMOS transistor MP2 resets the repair detect signal REP_DET to a logic high level of a power supply voltage VDD when the second reset signal WLCPB_B1 of a logic low level is input at a gate of the second PMOS transistor MP2.

While FIG. 6 does not show, the first and second reset signals WLCPB_B0 and WLCPB_B1 may be generated by combining an active command and a precharge command of any of bank BANK0 or BANK1.

Accordingly, the first and second reset signals WLCPB_B0 and WLCPB_B1 enable the reset unit 310 during the precharge mode of any of bank BANK0 or BANK1. The active command enables a corresponding cell matrix in response to a specific column address for a read operation or write operation.

The repair detect signal generation unit 720 generates the repair detect signal REP_DET and provides it to the node A in response to the first and second cell matrix signals XMAT_B0<0:n> and XMAT_B1<0:n> and a cut state of a plurality of fuses F_1 to F_n.

The repair detect signal generation unit 720 includes a plurality of unit fuse sets 720_1 to 720_n which are coupled in parallel between the node A and a ground voltage (VSS) terminal.

Hereinafter, a first unit fuse set 720_1 is described in detail as an example of the plurality of unit fuse sets 720_1 to 720_n. The first unit fuse set 720_1 includes a transfer gate TG_1 and a fuse F_1.

The transfer gate TG_1 applies a ground voltage VSS to the fuse F_1 when the any of cell matrix signal XMAT_B0<0> or XMAT_B1<0> of a logic high level is input at a gate of the transfer gate TG_1. The fuse F_1 applies the ground voltage VSS from the transfer gate TG_1 to the node A in response to a cut state of the fuse F_1. The cut state of the fuse F_1 includes a cut-off state and a no-cut state.

The first latch unit 730 includes an inverter-latch which inverts and latches the repair detect signal REP_DET of pulse signal at the node A to output an inverted repair detect signal /REP_DET to the first defect indication signal output unit 740 or the second defect indication signal output unit 750.

The first defect indication signal output unit 740 includes a first defect indication signal generation unit 741 and a second latch unit 742. The first defect indication signal output unit 740 outputs an inverse signal of the inverted repair detect signal /REP_DET as the first defect indication signal YA_B0 in response to the first bank enable signal WLCPB_LAT_B0. The first bank enable signal WLCPB_LAT_B0 is activated when the first bank BANK0 is enabled.

The first defect indication signal generation unit 741 outputs the inverted repair detect signal /REP_DET in response to the first bank enable signal WLCPB_LAT_B0 to the second latch unit 742. The second latch unit 742 includes an inverter-latch which inverts and latches the inverted repair detect signal /REP_DET to output the inverse signal of the inverted repair detect signal /REP_DET as the first defect indication signal YA_B0.

The second defect indication signal output unit 750 includes a second defect indication signal generation unit 751 and a third latch unit 752. The second defect indication signal output unit 750 outputs the inverted repair detect signal /REP_ DET as the second defect indication signal YA_B1 in response to the second bank enable signal WLCPB_LAT_B1. The second bank enable signal WLCPB_LAT_B1 is activated when the second bank BANK1 is enabled.

The second defect indication signal generation unit 751 outputs the inverted repair detect signal /REP_DET in response to the second bank enable signal WLCPB_LAT_B1 to the third latch unit 752. The third latch unit 752 includes an inverter-latch which inverts and latches the inverted repair detect signal /REP_DET to output the inverse signal of the inverted repair detect signal /REP_DET as the second defect indication signal YA_B1.

The first and second bank enable signals WLCPB_LAT_B0 and WLCPB_LAT_B0 are pulse signals. To latch the inverted repair detect signal /REP_DET activated for a short time when the first and second bank enable signals WLCPB_LAT_B0 and WLCPB_LAT_B0 of the pulse signals are activated, the second and third latch units 742 and 752 are required.

The fuse F_1 corresponding to a defective unit cell detected during testing of a semiconductor memory device is cut off. When a cell matrix signal XMAT_B0<0> is input, the transfer gate TG_1 corresponding to a selected cell matrix is turned-on to thereby apply a logic low level signal of the ground voltage VSS to the fuse F_1. However, when the selected cell matrix includes the defective unit cell, the repair detect signal REP_DET substantially maintains its reset state of a logic high level since the fuse is in a cut-off state. On the contrary, when the selected cell matrix does not include the defective unit cell, the repair detect signal REP_DET has a logic low level and the defect indication signal YA_B0 has a logic low level since the fuse is in a no-cut state.

Since the shared-fuse set 610A receives the first and second cell matrix signals XMAT_B0<0:n> and XMAT_B1<0:n> and generates the first and second defect indication signals YA_B0 and YA_B1 in response to the first and second bank enable signals WLCPB_LAT_B0 and WLCPB_LAT_B0, the shared-fuse set 610A may be shared by the first bank BANK0 and the second bank BANK1.

Figure 8:
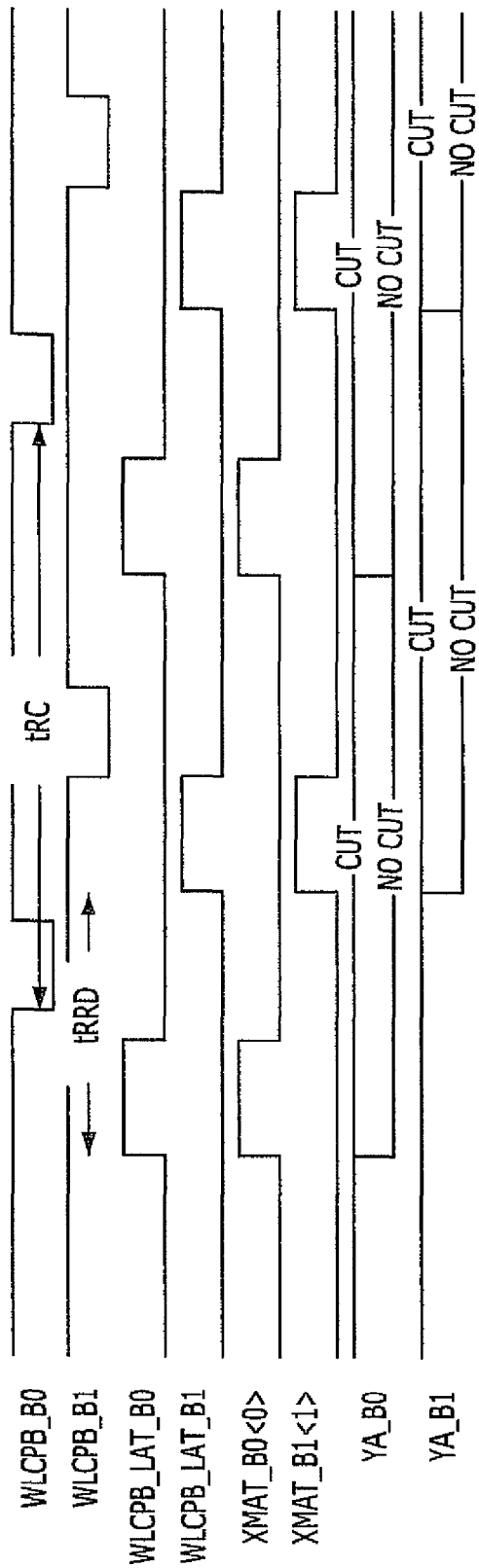
FIG. 8 is a timing diagram illustrating an operation of the fuse set in FIG. 7.

FIG. 8 is a timing diagram describing an operation of the shared-fuse set 610A in FIG. 7.

The operation of the shared-fuse set 610A may start at a reset mode in which the repair detect signal REP_DET at the node A is reset to a logic high level by the first reset signal WLCB_B0 or the second reset signal WLCB_B1 having a logic high level.

At this time, when the first cell matrix signal XMAT_B0<0> is activated to a logic high level, the ground voltage VSS of a logic low level is supplied to the fuse F_1.

When a cell matrix corresponding to the first cell matrix signal XMAT_B0<0> does not include the defective unit cell, the fuse F_1 is not cut. The ground voltage VSS is supplied to the repair detect signal REP_DET at the node A through the fuse F_1. The repair detect signal REP_DET transitions from the logic high level obtained during the reset mode to the logic low level due to the ground voltage VSS supplied through the fuse F_1. The repair detect signal REP_DET of the logic low level is output as the first defect indication signal YA_B0 of a logic low level in response to the first bank enable signal WLCPB_LAT_B0 of a logic high level which enables the first bank BANK0.

On the contrary, when the cell matrix corresponding to the first cell matrix signals XMAT_B0<0:n> includes a defective unit cell, the fuse F_1 is cut off. The ground voltage VSS is prevented from being supplied to the node A to affect the repair detect signal REP_DET. Thus, the repair detect signal REP_DET substantially maintains the reset mode with the logic high level. The repair detect signal REP_DET of a logic high level is output as the first defect indication signal YA_B0 of a logic high level in response to the first bank enable signal WLCPB_LAT_B0 of a logic high level which enables the first bank BANK0.

It is rare that the two adjacent banks are enabled simultaneously since the simultaneous enablement may cause an error in internal operation such as data collision to occur. According to According to an example, the first bank BANK0 and the second bank BANK1 may be sequentially enabled with a delay corresponding to tRRD (which is a row to row delay).

Here, an operation of the shared-fuse set 610A for a defective cell matrix included in the second bank BANK1 is the same as that of the first bank BANK0, and thus further detailed description thereof is omitted.

Figure 9:
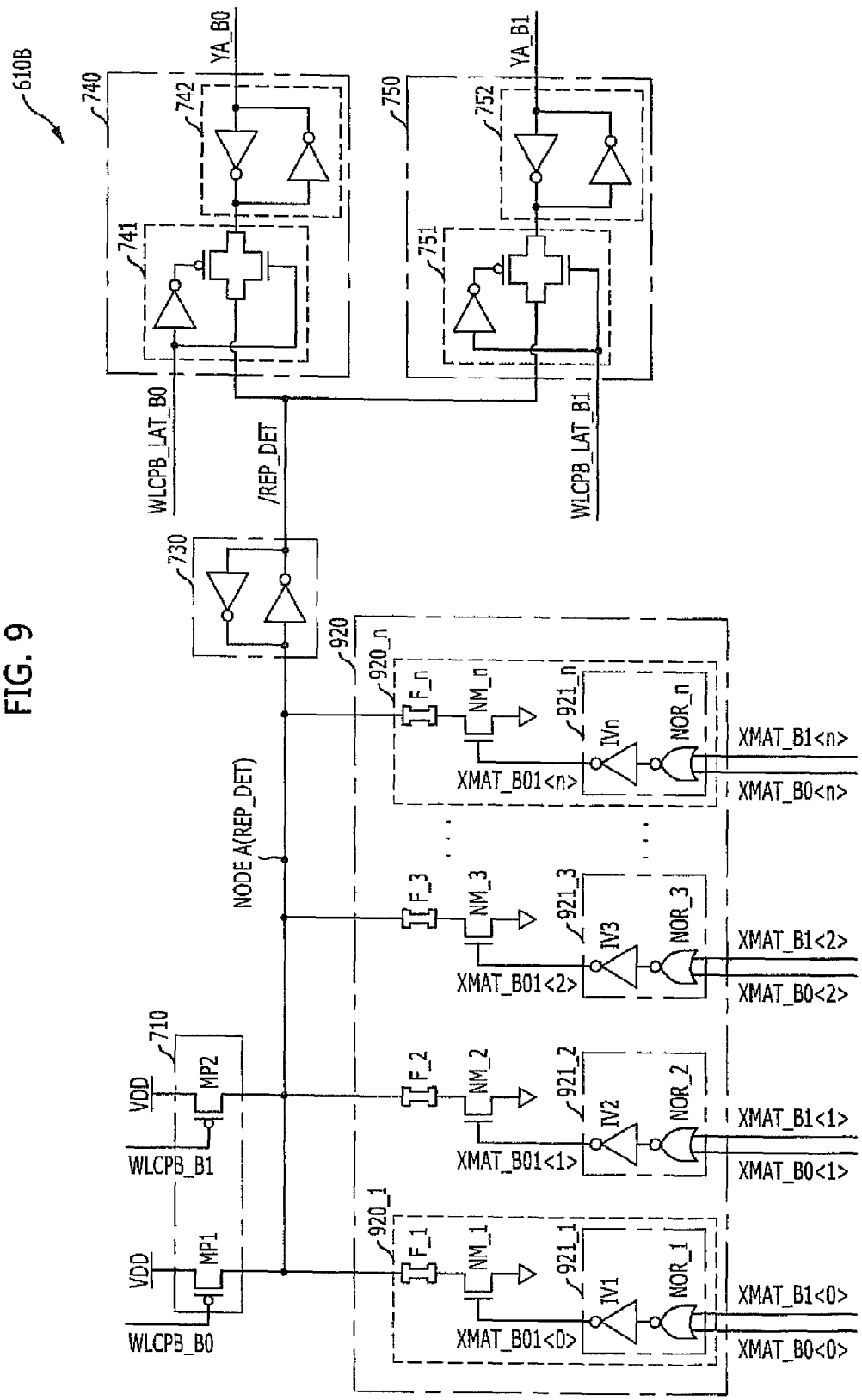
FIG. 9 is a circuit diagram of a shared-fuse set in accordance with another embodiment of the present invention.

FIG. 9 is a circuit diagram of a shared-fuse set in accordance with a second embodiment of the present invention.

The shared-fuse set in accordance with the second embodiment of the present invention is referred to as "a shared-fuse set 610B."

Referring to FIG. 9, the fuse set 610B includes a reset unit 710, a repair detect signal generation unit 920 and a first latch unit 730, a first defect indication signal output unit 740 and a second defect indication signal output unit 750.

The repair detect signal generation unit 920 generates the repair detect signal REP_DET and outputs the repair detect signal REP_DET to the node A in response to, for example, the first and second cell matrix signals XMAT_B0<0:n> and XMAT_B1<0:n> and a cut state of the fuses F_1 to F_*n*. The cut state of the fuse F_1 includes a cut-off state and a no-cut state.

The repair detect signal generation unit 920 includes a plurality of unit fuse sets 920_1 to 920_*n* coupled in parallel between the node A and a ground voltage terminal.

Hereinafter, a first unit fuse set 920_1 is described in detail as an example of the plurality of unit fuse sets 920_1 to 920_*n*. The first unit fuse set 920_1 includes a combination cell matrix signal generation unit 921_1, a NMOS transistor NM_1 and a fuse F_1.

The combination cell matrix signal generation unit 921_1 generates a combination cell matrix signals XMAT_B01<0:n> by using received the first and second cell matrix signals XMAT_B0<0:n> and XMAT_B1<0:n>.

For example, the combination cell matrix signal generation unit 921_1 includes a NOR-gate NOR_1 and an inverter IV1. The NOR-gate NOR_1 performs a NOR-operation of the first and second cell matrix signals XMAT_B0<0> and XMAT_B1<0>. The inverter IV1 inverts the output of the NOR-gate NOR_1 and outputs the inverted output as the combination cell matrix signals XMAT_B01<0>.

The NMOS transistor NM1 applies a ground voltage VSS to the fuse F_1 when the combination cell matrix signals XMAT_B01<0> of a high level is input at a gate of the NMOS transistor NM1. The fuse F_1 applies the ground voltage VSS from the NMOS transistor NM_1 to the node A in response to a cut state of the fuse F_1.

The combination cell matrix signal XMAT_B01<0> has a logic high level when at least one of the first and second cell matrix signals XMAT_B0<0> and XMAT_B1<0> has a logic high level. The same relationship applies between other combination matrix signals XMAT B01<1:n> and the first and second cell matrix signals XMAT_B0<1:n>.

Here, the shared-fuse set 610B has the same configuration as the shared-fuse set 610A except for the combination cell matrix signal generation unit 921_1, and thus further detailed description thereof is omitted.

Figure 10:
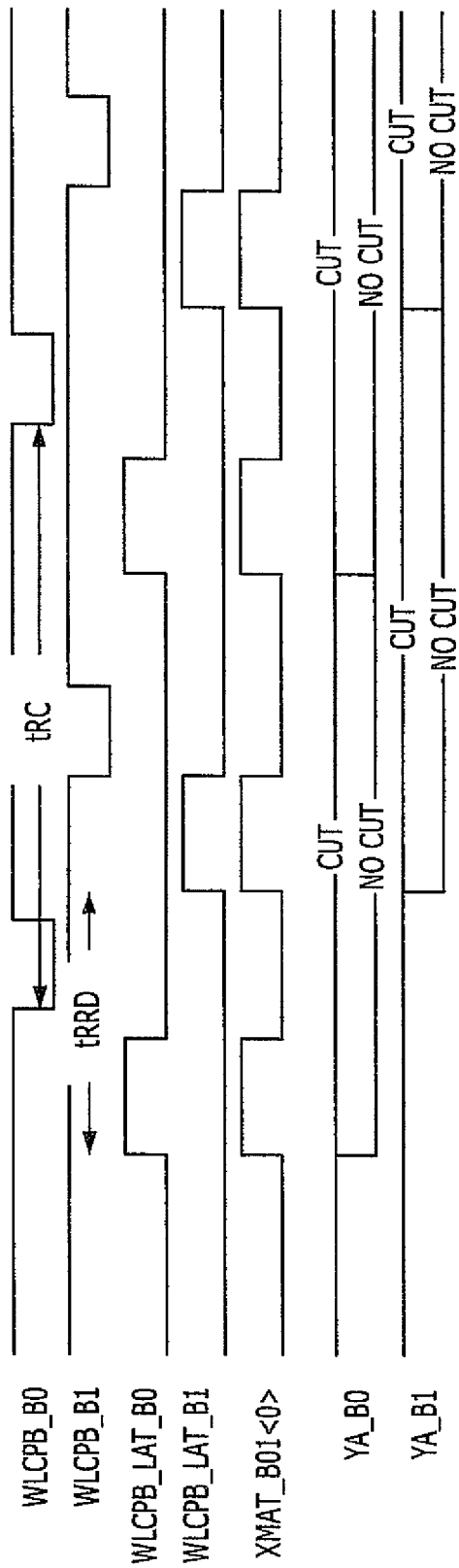
FIG. 10 is a timing diagram illustrating an operation of the fuse set in FIG. 9.

FIG. 10 is a timing diagram illustrating an operation of the shared-fuse set 610B in FIG. 9.

Referring to FIG. 9, the combination cell matrix signals XMAT_B01<0:n> is generated by NOR-operation of the first and second cell matrix signals XMAT_B0<0:n> and XMAT_B1<0:n>.

The combination cell matrix signal XMAT_B01<0:n> has a logic high level when at least one of the first and second cell matrix signals XMAT_B0<0:n> and XMAT_B1<0:n> has a logic high level.

Therefore, the activated section of the combination cell matrix signal XMAT_B01<0:n> in the timing diagram is substantially the same as a combination of the activated sections of the first and second cell matrix signals XMAT_B0<0:n> and XMAT_B1<0:n>. Thus, the timing diagram for the shared-fuse set 610B in FIG. 9 is the same as the timing diagram for the shared-fuse set 610B in FIG. 7 other than for the use of the combination cell matrix signal XMAT_B01<0:n>, and thus further detailed description thereof is omitted.

The shared-fuse set 610B can be shared by a plurality of banks as well as the first and second banks BANK0 and BANK1 if the number of the plurality of defect indication signal output units is equal to the number of the plurality of banks, the number of the plurality of transistors included in the reset unit 710 is equal to the number of the plurality of banks and the NOR-gate NOR_1 performs a NOR-operation of a plurality of cell matrix signals XMAT_B0*n*<0:n> of the plurality of banks.

As described above, according to an exemplary embodiment of the invention, a stack bank structure where column control regions of adjacent banks are arranged to contact each other is used where a number of the column redundancy circuits for two adjacent banks can be reduced to half and thus a decrease in the overall area of a semiconductor memory device occupied by column redundancy circuits may be achieved.

Even with the reduced number of column redundancy circuits being used, a defect repair operation can be supported. It is possible to effectively use the column redundancy circuits through effective use of fuse sets.

According to an exemplary embodiment of the present invention, in a stack bank structure where column control regions of two adjacent banks are arranged to contact each other, two adjacent banks share one shared-fuse set to reduce number of total column redundancy circuits and thus the overall size of the semiconductor memory device may be reduced.

Further, even if the total number of column redundancy circuits is reduced, the semiconductor memory device of the invention can support a defect repair operation.

While the present invention has been described with respect to the specific embodiments, it is apparent to those skilled in the art that various changes and modifications may be made without departing from the spirit and scope of the invention as defined in the following claims.

What is claimed is:

1. A semiconductor memory device, comprising:
    a first bank including a plurality of cell matrices;
    a second bank including a plurality of cell matrices; and
    a shared-fuse set, which is shared by the first bank and the second bank, configured to:
        receive a first cell matrix signal from the first bank and a second cell matrix signal from the second bank, wherein the first cell matrix signal and the second cell matrix signal indicate a cell matrix selected from the first bank and the second bank, respectively,
        generate, in response to the first cell matrix signal and the second cell matrix signal, a repair detect signal that indicates a defective cell in the selected cell matrix, and
        output a defect indication signal based on the repair detect signal, if the first bank or the second bank is enabled and a defective cell matrix exists in the enabled bank, wherein the shared-fuse set includes:
            a first defect indication signal output unit configured to output the repair detect signal as a first defect indication signal of the first bank if a first bank enable signal is activated; and
            a second defect indication signal output unit configured to output the repair detect signal as a second defect indication signal of the second bank if a second bank enable signal is activated, and
    wherein each of the first and second defect indication signal output units includes:
        a second latch unit configured to latch the repair detect signal if the first bank enable signal is activated, and
        a third latch unit configured to latch the repair detect signal if the second bank enable signal is activated.

2. The semiconductor memory device as recited in claim 1, wherein the shared-fuse set further includes:
    a repair detect signal generation unit configured to generate the repair detect signal in response to a cut state of a fuse corresponding to the first cell matrix signal of the first bank or the second cell matrix signal of the second bank.

3. The semiconductor memory device as recited in claim 2, wherein the shared-fuse set further includes:
    a first latch unit that is connected between the repair detect signal generation unit and the first and second defect indication signal output units, and that is configured to latch the repair detect signal.

4. The semiconductor memory device as recited in claim 2, wherein the shared-fuse set further includes:
    a reset unit configured to reset the repair detect signal to a first logic level, if the first bank or the second bank enters a precharge mode.

5. The semiconductor memory device as recited in claim 4, wherein the reset unit includes;
    a first transistor configured to reset the repair detect signal to the first logic level, if the first bank enters the precharge mode; and
    a second transistor configured to reset the repair detect signal to the first logic level, if the second bank enters the precharge mode.

6. The semiconductor memory device as recited in claim 2, wherein the repair detect signal generation unit includes:
    a cell matrix signal transfer unit configured to transfer a voltage having a second logic level to the fuse, in response to the first cell matrix signal or the second cell matrix signal; and
    wherein the fuse is configured to:
        be cut, if a cell matrix corresponding to the first cell matrix signal or the second cell matrix signal is defective, and
        maintain a first logic level of the repair detect signal when the fuse is cut.

7. The semiconductor memory device as recited in claim 6, wherein the cell matrix signal transfer unit includes:
    a transfer gate configured to transfer the voltage having the second logic level to the fuse in response to the first cell matrix signal or the second cell matrix signal.

8. The semiconductor memory device as recited in claim 6, wherein the cell matrix signal transfer unit includes:
    a combination cell matrix signal generation unit configured to generate a combination cell matrix signal having a first logic level, if the first cell matrix signal or the and second cell matrix signal has a first logic level; and
    a third transistor configured to transfer the voltage having the second logic level to the fuse in response to the combination cell matrix signal.

9. The semiconductor memory device as recited in claim 8, wherein the combination cell matrix signal generation unit includes:
    a NOR-gate configured to perform a NOR-operation on the first cell matrix signal and the second cell matrix signal; and
    an inverter configured to invert an output of the NOR-gate and output the inverted output as the combination cell matrix signal having the first logic level.

10. The semiconductor memory device as recited in claim 1, wherein the first bank and the second bank have a stack bank structure where column control regions of the first bank and of the second bank contact each other.

11. The semiconductor memory device as recited in claim 1, wherein the first and the second bank are sequentially enabled with a row to row delay (tRRD).

12. A semiconductor memory device, comprising:
    a plurality of banks including a plurality of cell matrices; and
    a shared-fuse set, which is shared by the plurality of banks and is configured to:
        receive, from the plurality of banks, cell matrix signals that indicate a cell matrix selected from the plurality of banks,
        generate, in response to the cell matrix signals, a repair detect signal that indicates a defective cell in the selected cell matrix, and output a defect indication signal based on the repair detect signal, if a bank, of the plurality of banks, is enabled and a defective cell matrix is included in the enabled bank wherein the shared-fuse set includes:
a plurality of defect indication signal output units configured to output the repair detect signal as the defect indication signal of the enabled bank if a bank enable signal of the enabled bank is activated,
wherein a number of the plurality of defect indication signal output units is equal to a number of the plurality of banks, and
wherein each of the plurality of defect indication signal output units includes:
a latch unit configured to latch the repair detect signal when a respective bank enable signal is activated.

13. The semiconductor memory device as recited in claim 12, wherein the shared-fuse set further includes:
a repair detect signal generation unit configured to generate the repair detect signal in response to a cut state of a fuse corresponding to a cell matrix signal of the enabled bank, if the cell matrix signal of the enabled bank among the plurality of banks is input; and
a plurality of defect indication signal output units configured to output the repair detect signal based on the defect indication signal of the enabled bank, if a bank enable signal of the enabled bank is activated,
wherein a number of the plurality of defect indication signal output units is equal to the number of the plurality of banks.

14. The semiconductor memory device as recited in claim 13, wherein the shared-fuse set includes:
a latch unit that is connected between the repair detect signal generation unit and the plurality of the defect indication signal output units, and that is configured to latch the repair detect signal.

15. The semiconductor memory device as recited in claim 13, wherein the shared-fuse set further comprises:
a reset unit configured to reset the repair detect signal to a first logic level, if the enabled bank enters a precharge mode.

16. The semiconductor memory device as recited in claim 15, wherein the reset unit includes:
a plurality of transistors configured to reset the repair detect signal to the first logic level, if the enabled bank enters the precharge mode,
wherein a number of the plurality of transistors is equal to a number of the plurality of banks.

17. The semiconductor memory device as recited in claim 13, wherein the repair detect signal generation unit includes:
a cell matrix signal transfer unit configured to transfer a voltage having a second logic level to the fuse in response to the cell matrix signal of the enabled bank; and
wherein the fuse is configured to:
be cut, if a cell matrix corresponding to the cell matrix signal is defective, and
maintain a first logic level of the repair detect signal when the fuse is cut.

18. The semiconductor memory device as recited in claim 17, wherein the cell matrix signal transfer unit includes:
a combination cell matrix signal generation unit configured to generate a combination cell matrix signal having a first logic level, if a cell matrix signal, of the plurality of the cell matrix signals, has the first logic level; and
a third transistor configured to transfer the voltage having the second logic level to the fuse in response to the combination cell matrix signal.

19. The semiconductor memory device as recited in claim 18, wherein the combination cell matrix signal generation unit includes:
a NOR-gate configured to perform a NOR-operation on the plurality of the cell matrix signals; and
an inverter configured to invert an output of the NOR-gate and output the inverted output as the combination cell matrix signal having the first logic level.

\* \* \* \* \*